United States Patent
Annapragada et al.

[11] Patent Number: 6,028,013
[45] Date of Patent: Feb. 22, 2000

[54] MOISTURE REPELLANT INTEGRATED CIRCUIT DIELECTRIC MATERIAL COMBINATION

[75] Inventors: Rao V. Annapragada; Samuel Vance Dunton; Milind Ganesh Weling; Subhas Bothra, all of San Jose, Calif.

[73] Assignee: VLSI Technology, Inc., San Jose, Calif.

[21] Appl. No.: 09/306,239

[22] Filed: May 6, 1999

[51] Int. Cl.[7] .................................................. H01L 21/44
[52] U.S. Cl. ........................ 438/783; 438/760; 438/761; 438/788
[58] Field of Search .................................. 438/760, 761, 438/778, 783, 788

[56] References Cited

U.S. PATENT DOCUMENTS

| | | | |
|---|---|---|---|
| 5,494,854 | 2/1996 | Jain | 437/195 |
| 5,763,010 | 6/1998 | Guo et al. | 427/376.2 |
| 5,943,261 | 8/1998 | Lee | 365/185.14 |

*Primary Examiner*—Chandra Chaudhari
*Assistant Examiner*—Lisa A Kilday
*Attorney, Agent, or Firm*—Martine Penilla & Kim, LLP

[57] ABSTRACT

A method of making an inter-metal oxide layer over a patterned metallization layer of a substrate, and the resulting structure having the inter-metal oxide layer are provided. The method includes depositing a fluorine doped high density plasma (HDP) oxide layer over the patterned metallization layer. The fluorine doped HDP oxide layer is configured to evenly deposit in high aspect ratio regions of the patterned metallization layer. The method also includes depositing a plasma enhanced chemical vapor deposition (PECVD) oxide layer over the fluorine doped HDP oxide layer. The PECVD oxide layer is doped with a phosphorous material. A CMP operation is then performed over the PECVD oxide layer to remove topographical oxide variations, such that the CMP operation will be configured to preferably leave at least a coating of the PECVD oxide layer over the HDP oxide layer. In this example, the phosphorous material in the PECVD oxide is configured to assist in creating a substantial moisture barrier over the fluorine doped HDP oxide layer and thus protect metallization lines from corrosion. In an alternative example, a non-conductive, highly moisture resistant barrier layer can be deposited in between the fluorine doped HDP oxide layer and the PECVD oxide.

14 Claims, 2 Drawing Sheets

MOISTURE REPELLANT INTEGRATED CIRCUIT DIELECTRIC MATERIAL COMBINATION

BACKGROUND OF THE INVENTION

1. Field of the Invention

The present invention relates generally to integrated circuits and, more particularly, to dielectric materials that have reduced dielectric constants.

2. Description of the Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices such as MOS transistors.

Conventionally, a dielectric layer is deposited over the devices and via holes are formed through the dielectric layer to the devices below. After the via holes are etched through the dielectric layer, a metallization layer is deposited over the dielectric surface filling the via holes to define metal filled contacts. After the first metallization layer has been deposited, it is patterned to form interconnect metallization lines. As is well known in the art, "patterning" may be accomplished by depositing a photoresist layer, selectively exposing the photoresist to light, developing the photoresist to form an etch mask, etching the exposed metallization to pattern the metallization layer, and removing the etch mask. This process may then be repeated if additional layers of metallization lines are desired.

As the demand for faster, more complex and compact IC chips increases, the performance of the interconnects has become increasingly important. Although individual transistor speeds have continued to improve by implementing shorter gate lengths and less resistive gate electrodes, improvements in interconnect structure speed has lagged.

As is well known in the art, the speed of interconnect structures is generally characterized in terms of RC delays (i.e., resistance/capacitance timing delays). Therefore, efforts at reducing RC delays in interconnect structures have involved experimentation with dielectric materials to reduce capacitance and with metals to reduce resistance. As is well known in the art, different metals have different resistivities, and each have different IC fabrication benefits and drawbacks. By way of example, the resistance of copper (Cu) and silver (Ag) are relatively lower than aluminum (Al), but these metals are known to be more susceptible to corrosion. In addition, lowering the resistance of metal interconnect lines typically does not result in as great a benefit as reducing interconnect capacitance since all metals have relatively low resistance.

As is well known in the art, the capacitance associated with an interconnect structure is directly proportional to the dielectric constant ($\epsilon_o$) of the dielectric layer lying between the "plates" of the capacitor, i.e., adjacent metallization layers (i.e., $C\alpha\epsilon_o$). Therefore, interconnect capacitance may be reduced by lowering the dielectric constant of the material lying between metallization lines. Conventionally, silicon dioxide having a dielectric constant of about 4.1 or greater is used to isolate the various interconnect metallization lines in IC chips. However, there have been various unsuccessful attempts at reducing capacitance by developing low dielectric materials. Such materials include organic-type dielectrics which have dielectric constants between about 2.0 and 4.0.

Unfortunately, the use of organic-type dielectrics present various fabrication difficulties. By way of example, fabrication difficulties may include excessive moisture uptake, increased susceptibility to sodium contamination, and a lack of global planarization schemes available to planarize organic-type dielectric materials. As a result, many IC manufacturers avoid excessive cost and time consuming fabrication processes associated with organic-type dielectrics.

In addition, as device dimensions continue to decrease, fabrication engineers have been implementing high density plasma (HDP) oxide deposition techniques. HDP oxide is used because of its good ability to fill-in high aspect ratio regions between, for example, adjacent metallization lines. FIG. 1A is a cross-sectional view of a semiconductor device that implements an HDP oxide 14. For example, a substrate 10 is shown having patterned metallization lines 12, which define high aspect ratio regions. The HDP oxide 14 thus fills these regions without causing well known voids in between the lines. The process of depositing the HDP oxide 14 requires a special HDP chamber and is relatively slower than other oxide deposition techniques. In addition, the HDP oxide 14 leaves pyramids 14 over the metallization lines 12. Accordingly, fabrication engineers typically prefer to deposit another layer of oxide 16 over the HDP oxide 14. Oxide layer 16 is typically formed using a plasma enhanced chemical vapor deposition (PECVD) process, which is configured to deposit the oxide at a faster rate than the HDP oxide 14.

A known problem with the device structure having the oxide layer 16 is that mobile ions easily migrate through the oxide layer 16 and HDP oxide 14 and end up trapped in the gate oxides (not shown) of transistor devices. The most common mobile ions are sodium and potassium ions, and once they migrate to and contaminate the gate oxides, the transistor devices fail to operate at their optimum design levels. Once the oxide layer 16 is deposited, a chemical mechanical polishing (CMP) operation is performed to substantially planarize the top surface of the oxide layer 16 as shown in FIG. 1B.

As the need for faster integrated circuit devices continues to increase, fabrication engineers will also continue to push for new ways of decreasing the dielectric constant of the oxide materials. To this end, the HDP oxide 14 is now being deposited in the form of a fluorinated silica glass (FSG) layer, which has a lower dielectric constant of about 3.5. Although the FSG layer absorbs very little moisture from the atmosphere, when the material is subjected to the CMP process as shown in FIG. 1B, the moisture in the exposed and unexposed FSG layer reacts with the fluorine, which results in the formation of hydrofluoric acid (HF). As is well known, the presence of HF can be very detrimental because it can migrate to metallization interconnect lines and cause corrosion. If the metallization lines become corroded, the electrical performance of the entire semiconductor device can suffer greatly, and in fact, it may fail to operate within specification and thus will result in substantial yield loss. In addition, moisture in the FSG layer also has the possibility of causing metal delamination.

In the past, techniques used to remove moisture in the FSG layer included, for example, performing nitrogen plasma treatments. Nitrogen plasma treatments are typically done in expensive HDP chambers and the typical duration of the treatment lasts approximately one minute. This, of course, presents a significant impact on throughput as wells as increases fabrication costs. Nitrogen plasma treatments also result in some incorporation of nitrogen into the FSG layer, which may increase the dielectric constant. Another attempted solution included depositing a silane oxide (stochiometric or silicon rich) layer on top of the FSG layer in an effort to prevent moisture penetration into the FSG layer. However, stochiometric oxide does not have good moisture barrier properties. In addition, if the oxide is silicon rich, the dielectric constant of the combined oxide dielectric will also increase, thus raising the over all capacitance.

In view of the foregoing, there is a need for semiconductor fabrication techniques that enable the implementation of low dielectric constant dielectrics, while avoiding the possibility of device failures induced by CMP operations.

SUMMARY OF THE INVENTION

Broadly speaking, the present invention fills these needs by providing fabrication methods that facilitate the formation of reliable dielectric materials with reduced dielectric constants. The present invention also provides semiconductor structures having reliable multi-layer dielectric materials that, once subjected to CMP operations, are resistant to metallization destructive chemical reactions. It should be appreciated that the present invention can be implemented in numerous ways, including as a process, an apparatus, a system, and a device. Several inventive embodiments of the present invention are described below.

In one embodiment, a method of making an inter-metal oxide layer over a patterned metallization layer of a substrate is disclosed. The method includes depositing a high density plasma (HDP) oxide layer over the patterned metallization layer. The HDP oxide layer is configured to evenly deposit in high aspect ratio regions of the patterned metallization layer. The method also includes depositing a plasma enhanced chemical vapor deposition (PECVD) oxide layer over the HDP oxide layer. The PECVD oxide layer is doped with a phosphorous material. A CMP operation is then performed over the PECVD oxide layer to remove topographical oxide variations, and the CMP operation is preferably configured to leave at least a coating of the PECVD oxide layer over the HDP oxide layer.

In another embodiment, an inter-metal oxide combination is disclosed. The combination includes a high density plasma (HDP) oxide layer that is defined over a patterned conductive layer, and a phosphorous doped oxide layer that is defined over the HDP oxide layer. Preferably, at least a layer of about 1,000 angstroms of the phosphorous doped oxide layer is configured to remain over the HDP oxide layer after a CMP operation is performed. In a preformed embodiment, the HDP oxide layer is doped with fluorine so that the HDP oxide layer becomes a fluorinated silica glass (FSG) layer having a reduced dielectric constant. The phosphorous doped oxide layer is also well configured to protect the FSG layer from absorbing moisture.

In yet another embodiment, a method of making an inter-metal oxide layer over a patterned metallization layer of a substrate is disclosed. The method includes: (a) depositing a fluorine doped high density plasma (HDP) oxide layer over the patterned metallization layer, the fluorine doped HDP oxide layer is configured to evenly deposit in high aspect ratio regions of the patterned metallization layer; (b) depositing a nonconductive barrier layer over the fluorine doped HDP oxide layer; (c) depositing a plasma enhanced chemical vapor deposition (PECVD) oxide layer over the non-conductive barrier layer, the PECVD oxide layer is doped with a phosphorous material; and (d) performing a CMP operation over the PECVD oxide layer to remove topographical oxide variations, the CMP operation is configured to leave at least a coating of the non-conductive barrier layer over the fluorine doped HDP oxide layer. Preferably, the non-conductive barrier layer is either SiON or SiN.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for fabrication methods that facilitate the formation of reliable dielectric materials with reduced dielectric constants. The present invention also provides semiconductor structures having reliable multi-layer dielectric materials that, once subjected to CMP operations, are resistant to metallization destructive moisture induced chemical reactions. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
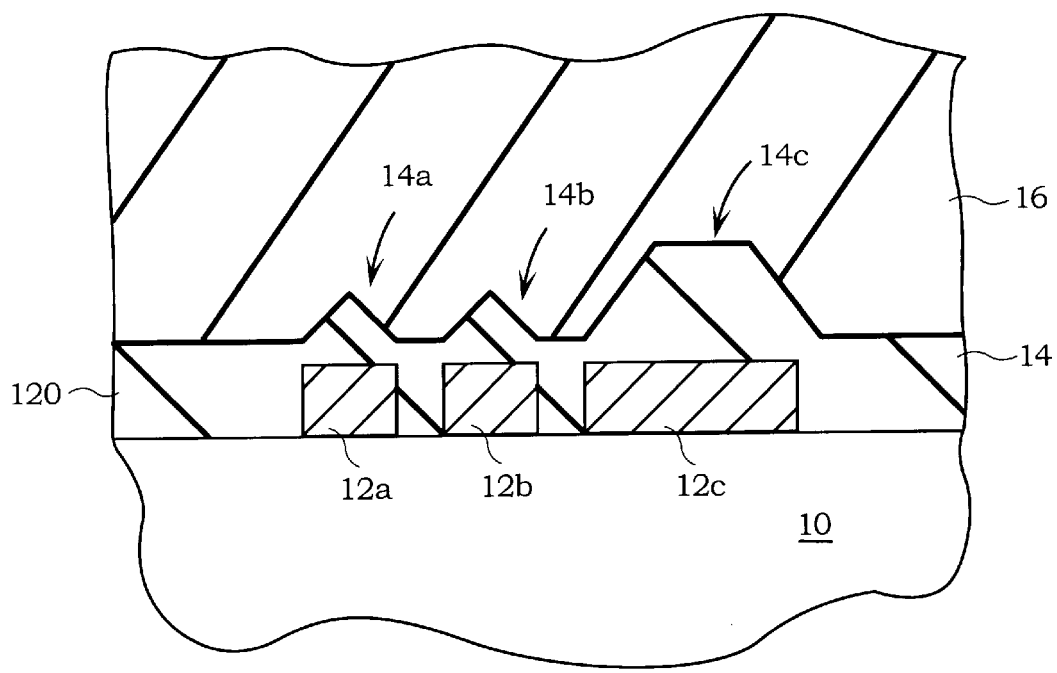
FIGS. 1A and 1B illustrate cross-sectional views of prior art inter-metal dielectric materials, which posses several fabrication and reliability drawbacks.
Figure 1B:
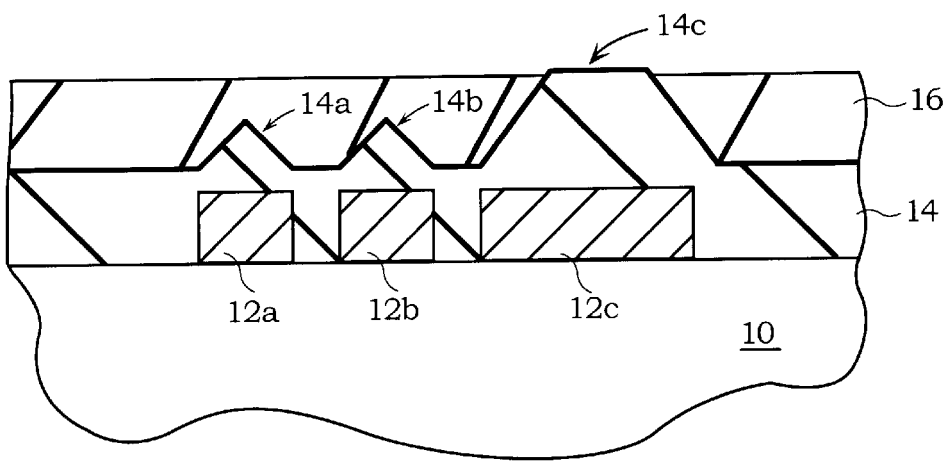
Figure 2:
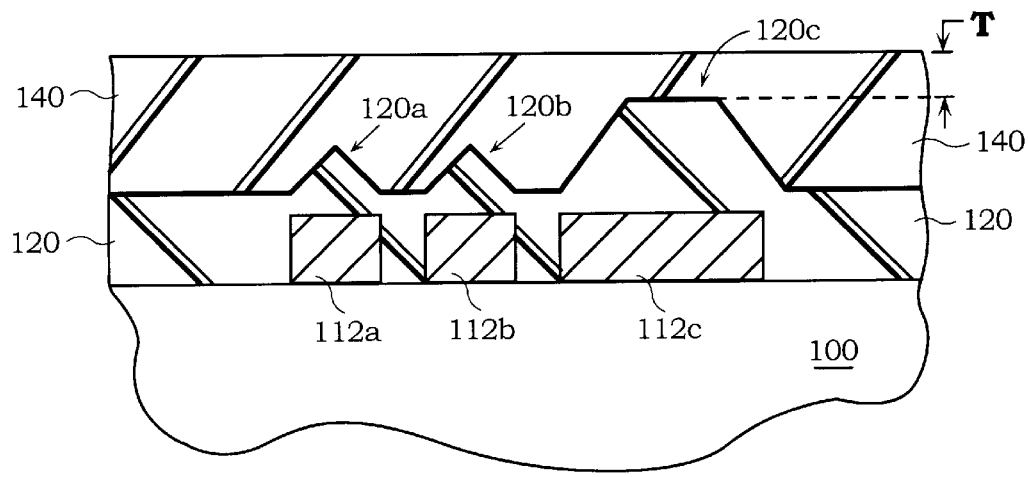
FIG. 2 is cross-sectional view of a semiconductor device that has several fabricated layers, in accordance with one embodiment of the present invention.

FIG. 2 is a cross-sectional view of a semiconductor device that has several fabricated layers, in accordance with one embodiment of the present invention. As shown, a substrate, which may represent any layer in the fabrication of the semiconductor device, has patterned metallization lines 112. In typically designs, the widths and lengths of the patterned metallization lines 112 vary depending on their placement and functionality. For instance, metallization lines 112a and 112b may be used for completing interconnections in the core region of a chip, while metallization line 112c may be used for power buses or bond pads.

When a high density plasma (HDP) operation is performed to deposit an initial layer of oxide over the high aspect regions between the metallization lines 112, oxide pyramids 120 tend to form. Over narrow lines 112a and 112b, the pyramids are more pointed and over wider lines 112c they are substantially thicker and flat. Although an HDP operation have this downside, it is preferred because of its ability to fill the high aspect regions without forming voids. In this embodiment, the HDP oxide is a fluorinated silica glass (FSG) oxide 120. As an example, the FSG oxide 120 may be deposited to a thickness of about 4,000 angstroms. The use of FSG, as mentioned above, is used because it has a reduced dielectric constant, which is about 3.5. The fluorine content that is incorporated in the oxide 120, in this embodiment, ranges between about 3% by weight and about 10% by weight, and more preferably ranges between about 5% by weight and about 8% by weight, and most preferably is about 6.5% by weight. The reduction in dielectric constant is primarily driven by the desire to fabricate faster devices.

Now that the FSG oxide 120 is deposited to a suitable thickness, the method advances to an operation where a PECVD oxide is deposited over the FSG oxide 120. Preferably, the PECVD oxide is a phosphorous doped "phosphosilicate glass" (PSG) oxide. In this embodiment, the PSG oxide 140 is selected because the phosphorous has the ability to tightly hold mobile atoms within the oxide 140 and also has good moisture barrier properties. As mentioned above, when mobile atoms are allowed to migrate down into transistor gate oxides, the transistor devices will fail to operate at their designed optimum levels. In one embodiment, the PSG oxide 140 has a preferable phosphorous content ranging between about 0.75% by weight and about 5% by weight, and more preferably between about 1% by weight and about 4% by weight, and most preferably about 2% by weight phosphorus. In one example, the thickness of the PSG oxide 140 can be about 8,000 angstroms. Of course, it should be understood that the actual thickness generally depends upon the desired dielectric separation between metal layers.

Now that the PSG oxide 140 is deposited to a desired thickness, a CMP operation is performed to substantially planarize the top surface of the oxide. Although the CMP process and associated cleaning implements chemicals and water, the phosphorus of the PSG oxide 140 will act as a moisture repelling surface. However, if any moisture penetrates the PSG oxide 140, that moisture will be prevented from contaminating the FSG oxide, (thus preventing metallization corrosion). In this preferred embodiment, the CMP operation is performed such that at least a 1,000 angstroms thickness (T) of the PSG oxide 140 remains over the FSG oxide 120c. This oxide thickness over the FSG oxide 120c can range between 1,500 and 2,500.

Figure 3:
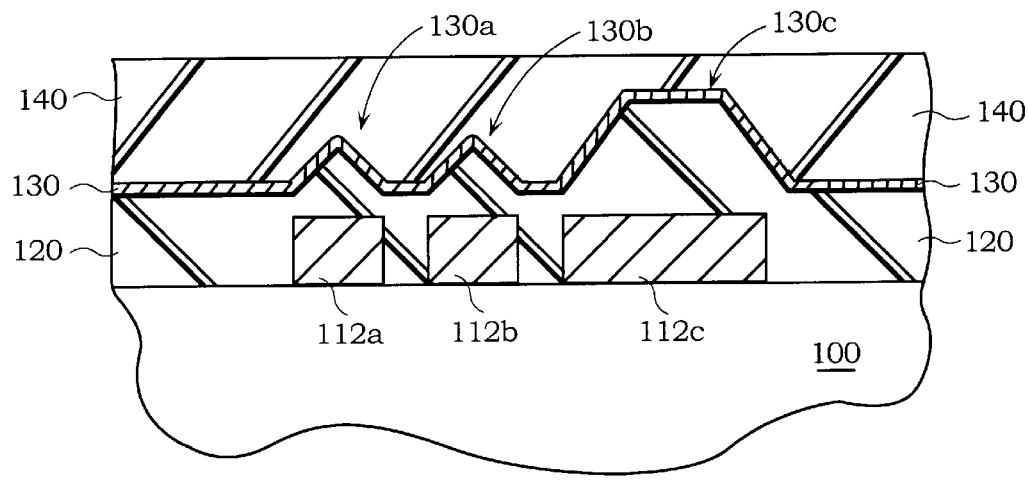
FIG. 3 illustrates an alternative embodiment of the present invention, in which a non-conductive barrier layer is formed between the doped oxide layers of FIG. 2.

In an alternative embodiment of FIG. 3, a barrier layer 130 is used to assist in reducing the possibility of moisture finding its way into the FSG oxide 120. Preferably, a silicon oxy nitride (SiON) layer or a silicon nitride (SiN) layer is deposited over the FSG layer 120. In order to maintain the dielectric constant of the inter-metal oxide down, the thickness of the barrier layer is maintained as thin as possible. Thus, the preferably thickness of the barrier layer 130 is maintained below about 600 angstroms, and more preferably, between 200 and 500 angstroms. With regard to process simplicity, the barrier layer 130 can be deposited in-situ in the same chamber used to deposit the PSG layer 140.

Figure 4:
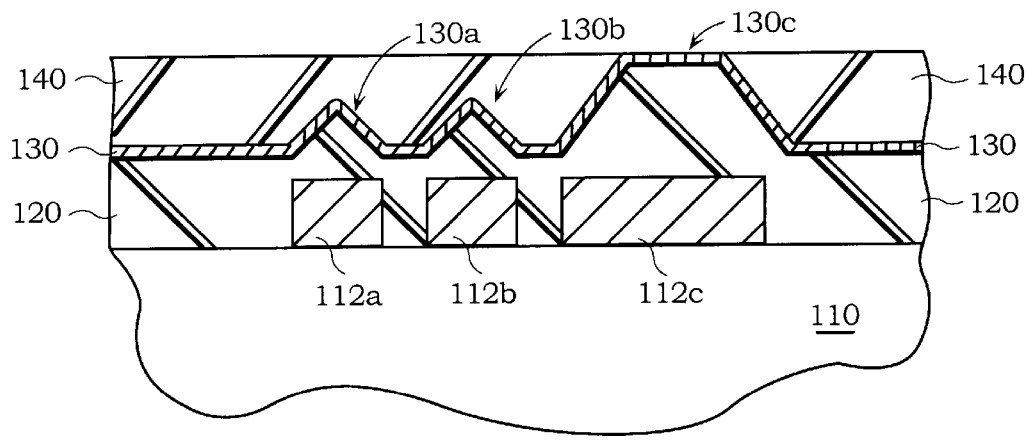
FIG. 4 shows the structure of FIG. 3, after a CMP operation is performed when the non-conductive barrier layer acts as a CMP stop, in accordance with one embodiment of the present invention.

Although both the SiON layer and the SiN layer work well as moisture barriers, the silicon nitride layer can also function as a CMP stop layer. That is, when the CMP operation that is implemented to planarize the PSG oxide 140 progresses toward high points of the SiN barrier layer (e.g., such as over 120c) of FIG. 4, the CMP operation will remove the SiN material at a slower rate than the PSG oxide 140. Thus, when SiN is used as the barrier layer 130, it will work as both a moisture barrier and a CMP stop. It should also be noted that the use of the barrier layer 130 has the advantage of preventing moisture from being introduced into the FSG layer 120 in the first place, which is counter to the techniques suggested by the prior art. As mentioned with regard to prior art, it is recommended that nitrogen plasma treatments be performed to "remove" moisture from the FSG layer.

In summary, the inventive combination of oxide layers used in between conductive layers (e.g., between poly and metal, and metal and metal) can achieve a reduction in the dielectric constant which assists in reducing line capacitance, and thus increasing circuit speed. The combination of oxide layers are also well suited to fill-in high aspect ratio regions and resist moisture penetration that can be introduced into and be detrimental to the reliability of an integrated circuit device.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of making an inter-metal oxide layer over a patterned metallization layer of a substrate, comprising:

depositing a high density plasma (HDP) oxide layer over the patterned metallization layer, the HDP oxide layer being configured to evenly deposit in high aspect ratio regions of the patterned metallization layer;

depositing a plasma enhanced chemical vapor deposition (PECVD) oxide layer over the HDP oxide layer, the PECVD oxide layer being doped with a phosphorous material; and performing a CMP operation over the PECVD oxide layer to remove topographical oxide variations, the CMP operation being configured to leave a coating of at least 1,000 Å of the PECVD oxide layer over the HDP oxide layer.

2. A method of making an inter-metal oxide layer over a patterned metallization layer of a substrate as recited in claim 1, wherein the HDP oxide is doped with fluorine to create a fluorinated silica glass (FSG) oxide.

3. A method of making an inter-metal oxide layer over a patterned metallization layer of a substrate as recited in claim 2, wherein a content of the phosphorous material ranges between about 0.75% by weight and about 5% by weight.

4. A method of making an inter-metal oxide layer over a patterned metallization layer of a substrate as recited in claim 3, wherein a content of the fluorine in the FSG oxide ranges between about 3% by weight and about 10% by weight.

5. A method of making an inter-metal oxide layer over a patterned metallization layer of a substrate as recited in claim 4, wherein the coating of the PECVD oxide layer is at least about 1,000 angstroms.

6. A method of making an inter-metal oxide layer over a patterned metallization layer of a substrate as recited in claim 2, further comprising:

forming a barrier layer over the FSG oxide.

7. A method of making an inter-metal oxide layer over a patterned metallization layer of a substrate as recited in claim 6, wherein the barrier layer is defined from silicon oxy nitride, which acts as a moisture barrier.

8. A method of making an inter-metal oxide layer over a patterned metallization layer of a substrate as recited in claim 6, wherein the barrier layer is defined from silicon nitride.

9. A method of making an inter-metal oxide layer over a patterned metallization layer of a substrate as recited in claim 8, wherein the silicon nitride acts as both a moisture barrier and a CMP stop.

10. A method of making an inter-metal oxide layer over a patterned metallization layer of a substrate, comprising:

depositing a fluorine doped high density plasma (HDP) oxide layer over the patterned metallization layer, the fluorine doped HDP oxide layer being configured to evenly deposit in high aspect ratio regions of the patterned metallization layer;

depositing a non-conductive barrier layer over the fluorine doped HDP oxide layer;

depositing a plasma enhanced chemical vapor deposition (PECVD) oxide layer over the non-conductive barrier layer, the PECVD oxide layer being doped with a phosphorous material; and performing a CMP operation over the PECVD oxide layer to remove topographical oxide variations, the CMP operation being configured to leave at least a coating of the non-conductive barrier layer over the fluorine doped HDP oxide layer.

11. A method of making an inter-metal oxide layer over a patterned metallization layer of a substrate as recited in claim 10, wherein a content of the phosphorous material ranges between about 0.75% by weight and about 5% by weight.

12. A method of making an inter-metal oxide layer over a patterned metallization layer of a substrate as recited in claim 10, wherein a content of the fluorine in the fluorine doped HDP oxide layer ranges between about 3% by weight and about 10% by weight.

13. A method of making an inter-metal oxide layer over a patterned metallization layer of a substrate as recited in claim 10, wherein the non-conductive barrier layer has a thickness that is less than about 600 angstroms.

14. A method of making an inter-metal oxide layer over a patterned metallization layer of a substrate, comprising:

depositing a fluorinated silica glass (FSG) oxide layer over the patterned metallization layer, the FSG oxide layer being configured to evenly deposit in high aspect ratio regions of the patterned metallization layer;

depositing a plasma enhanced chemical vapor deposition (PECVD) oxide layer over the FSG oxide layer, the PECVD oxide layer being doped with a phosphorous material; and performing a CMP operation over the PECVD oxide layer to remove topographical oxide variations, the CMP operation being configured to leave a coating of the PECVD oxide layer over the FSG oxide layer, such that the FSG oxide does not come in contact with fluid residues of the CMP operation.

* * * * *